US011916018B2

United States Patent
Weng et al.

(10) Patent No.: US 11,916,018 B2
(45) Date of Patent: Feb. 27, 2024

(54) MANUFACTURING METHOD OF CONNECTION STRUCTURE OF SEMICONDUCTOR DEVICE

(71) Applicant: UNITED MICROELECTRONICS CORP., Hsin-Chu (TW)

(72) Inventors: Chen-Yi Weng, New Taipei (TW); Shih-Che Huang, Chiayi (TW); Ching-Li Yang, Ping-Tung Hsien (TW); Chih-Sheng Chang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 369 days.

(21) Appl. No.: 17/191,730

(22) Filed: Mar. 4, 2021

(65) Prior Publication Data

US 2021/0193575 A1 Jun. 24, 2021

Related U.S. Application Data

(62) Division of application No. 15/730,744, filed on Oct. 12, 2017, now Pat. No. 10,978,391.

(30) Foreign Application Priority Data

Sep. 11, 2017 (CN) .......................... 201710811713.X

(51) Int. Cl.
*H01L 23/528* (2006.01)
*H01L 23/532* (2006.01)
(Continued)

(52) U.S. Cl.
CPC .... *H01L 23/5283* (2013.01); *H01L 23/49838* (2013.01); *H01L 23/5228* (2013.01);
(Continued)

(58) Field of Classification Search
CPC ......... H01L 21/76838; H01L 21/76886; H01L 23/5283; H01L 23/5222; H01L 23/647; H01L 27/3279; H01L 27/329
See application file for complete search history.

(56) References Cited

U.S. PATENT DOCUMENTS 4,425,183 A    1/1984  Maheras
5,726,498 A *  3/1998  Licata ................. H01L 23/5283
                                                   257/E23.152
(Continued)

FOREIGN PATENT DOCUMENTS

CN      103972158 A      8/2014
JP      2006108235 A *   4/2006  ............. H01L 24/03

*Primary Examiner* — Dale E Page
*Assistant Examiner* — Abbigale A Boyle
(74) *Attorney, Agent, or Firm* — Winston Hsu

(57) ABSTRACT

A connection structure of a semiconductor device is provided in the present invention. The connection structure includes an interlayer dielectric, a top metal structure, and a passivation layer. The interlayer dielectric is disposed on a substrate. The top metal structure is disposed on the interlayer dielectric. The top metal structure includes a bottom portion and a top portion disposed on the bottom portion. The bottom portion includes a first sidewall, and the top portion includes a second sidewall. A slope of the first sidewall is larger than a slope of the second sidewall. The passivation layer is conformally disposed on the second sidewall, the first sidewall, and a top surface of the interlayer dielectric.

6 Claims, 2 Drawing Sheets

(51) Int. Cl.
  *H01L 23/498* (2006.01)
  *H01L 23/522* (2006.01)
(52) U.S. Cl.
  CPC .... *H01L 23/53214* (2013.01); *H01L 23/5222* (2013.01); *H01L 23/5329* (2013.01)

(56) References Cited

U.S. PATENT DOCUMENTS

| | | | |
|---|---|---|---|
| 6,753,608 B2* | 6/2004 | Tomita | H01L 23/562 |
| | | | 438/624 |
| 6,822,336 B2* | 11/2004 | Kurita | H01L 24/13 |
| | | | 257/781 |
| 7,026,649 B2* | 4/2006 | Kang | H01L 29/42384 |
| | | | 257/E27.111 |
| 7,235,844 B2* | 6/2007 | Itou | H01L 24/03 |
| | | | 257/782 |
| 7,348,672 B2 | 3/2008 | Chen | |
| 7,538,039 B2* | 5/2009 | Sasagawa | H10K 59/131 |
| | | | 257/E21.582 |
| 7,928,534 B2 | 4/2011 | Hsu | |
| 8,564,139 B2* | 10/2013 | Lee | H01L 23/3128 |
| | | | 257/773 |
| 8,952,543 B2 | 2/2015 | Lee | |
| 9,153,499 B2 | 10/2015 | Kim | |
| 9,305,887 B2* | 4/2016 | Zeng | H01L 23/564 |
| 9,425,147 B2* | 8/2016 | Nakao | H01L 21/76832 |
| 9,543,250 B2 | 1/2017 | An | |
| 10,002,830 B2 | 6/2018 | Stecher | |
| 10,090,267 B2* | 10/2018 | Lee | H01L 24/13 |
| 10,541,218 B2* | 1/2020 | Cheng | H01L 21/02282 |
| 11,063,110 B2* | 7/2021 | Lee | H01L 23/5283 |
| 11,373,970 B2* | 6/2022 | Cheng | H01L 21/32139 |
| 2005/0280120 A1* | 12/2005 | Tomita | H01L 23/522 |
| | | | 257/632 |
| 2007/0181883 A1* | 8/2007 | Ando | H10B 12/09 |
| | | | 257/E27.097 |
| 2013/0214234 A1 | 8/2013 | Gopalan | |
| 2015/0303104 A1 | 10/2015 | Chen | |
| 2018/0061752 A1 | 3/2018 | Huang | |
| 2018/0151520 A1* | 5/2018 | Lin | H01L 24/02 |

* cited by examiner

MANUFACTURING METHOD OF CONNECTION STRUCTURE OF SEMICONDUCTOR DEVICE

CROSS REFERENCE TO RELATED APPLICATIONS

This application is a division of application Ser. No. 15/730,744 filed on Oct. 12, 2017, now allowed, which is incorporated by reference herein in its entirety.

BACKGROUND OF THE INVENTION

1. Field of the Invention

The present invention relates to a connection structure of a semiconductor device and a manufacturing method thereof, and more particularly, to a connection structure including a top metal structure and a manufacturing method thereof.

2. Description of the Prior Art

In the semiconductor manufacturing related field, the size of functional devices (such as transistors) in the integrated circuits becomes smaller continuously for enhancing the performance of the chip. However, as the density of the functional devices increased, resistive-capacitive delay (RC delay) becomes an important issue influencing the performance of the devices. Accordingly, the RC delay has to be reduced by lowering the resistance of the metal interconnect structure and/or reducing the capacitance of the inter-layer dielectric (ILD) material.

In the metal interconnect structure, a protection layer may be formed on a top metal at a top portion of the metal interconnect structure and cover the top metal and the ILD. However, problems such as poor covering condition of the protection layer and cracks generated in the protection layer may occur because the top metal is much thicker than the protection layer generally. The metal interconnect structure disposed in the ILD or even the semiconductor devices under the ILD may be affected by the problems mentioned above, and the product manufacturing yield and the reliability may be deteriorated accordingly.

SUMMARY OF THE INVENTION

A connection structure of a semiconductor device and a manufacturing method thereof are provided in the present invention. A top metal structure including two sidewall sections with different slopes is used to improve covering condition of a passivation layer formed on the top metal structure and an interlayer dielectric, cracks in the passivation layer may be avoided, and the manufacturing yield and the reliability of the products may be enhanced accordingly.

According to an embodiment of the present invention, a connection structure of a semiconductor device is provided. The connection structure includes an interlayer dielectric, a top metal structure, and a passivation layer. The interlayer dielectric is disposed on a substrate. The top metal structure is disposed on the interlayer dielectric. The top metal structure includes a bottom portion and a top portion disposed on the bottom portion. The bottom portion includes a first sidewall, and the top portion includes a second sidewall. A slope of the first sidewall is larger than a slope of the second sidewall. The passivation layer is conformally disposed on the second sidewall, the first sidewall, and a top surface of the interlayer dielectric.

According to an embodiment of the present invention, a manufacturing method of a connection structure of a semiconductor device is provided. The manufacturing method includes the following steps. Firstly, a substrate is provided. An interlayer dielectric is formed on the substrate. A top metal structure is formed on the interlayer dielectric. The top metal structure includes a bottom portion and a top portion disposed on the bottom portion. The bottom portion includes a first sidewall, and the top portion includes a second sidewall. A slope of the first sidewall is larger than a slope of the second sidewall. A passivation layer is conformally formed on the second sidewall, the first sidewall, and a top surface of the interlayer dielectric.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 2-4 are schematic drawings illustrating a manufacturing method of a connection structure of a semiconductor device according to an embodiment of the present invention, wherein FIG. 3 is a flow chart of an etching process, and FIG. 4 is a schematic drawing in a step subsequent to FIG. 2.

DETAILED DESCRIPTION

Figure 1:
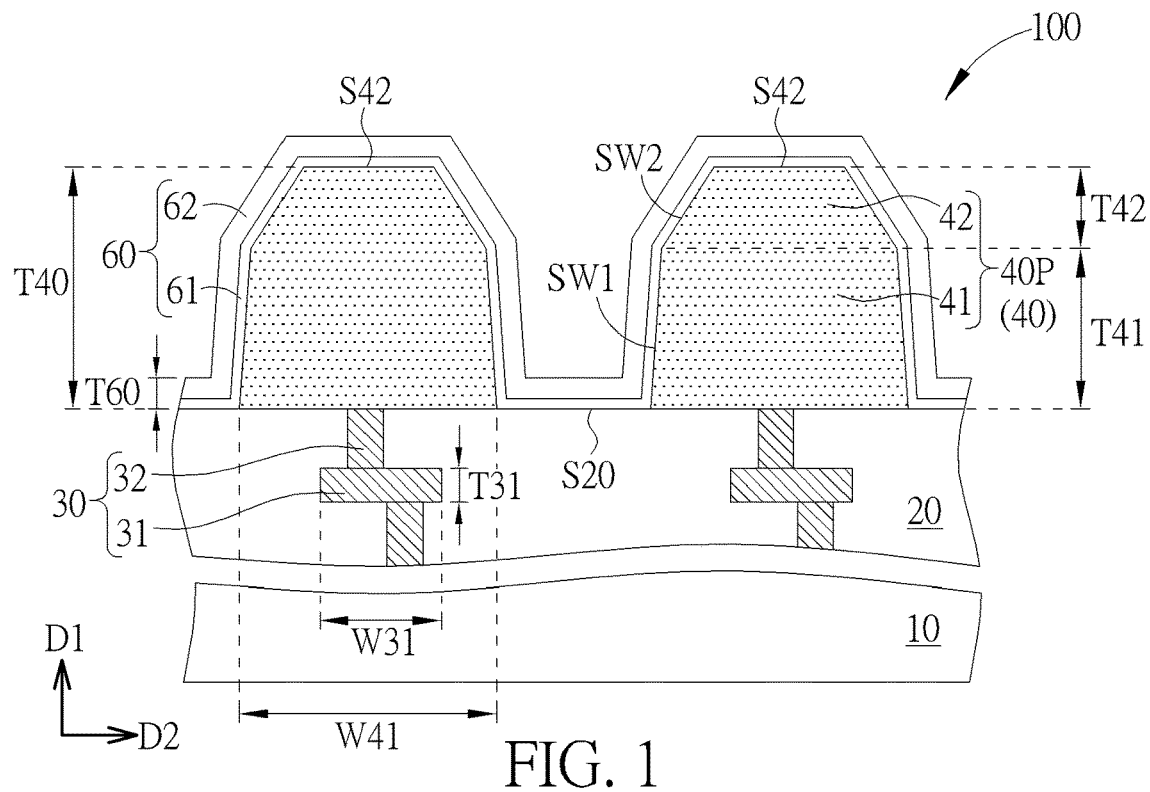
FIG. 1 is a schematic drawing illustrating a connection structure of a semiconductor device according to an embodiment of the present invention.

Please refer to FIG. 1. FIG. 1 is a schematic drawing illustrating a connection structure of a semiconductor device according to an embodiment of the present invention. As shown in FIG. 1, the connection structure 100 of the semiconductor device includes an interlayer dielectric (ILD) 20, a top metal structure 40P, and a passivation layer 60. The interlayer dielectric 20 is disposed on a substrate 10. The substrate may include a semiconductor substrate such as a silicon substrate, a silicon germanium substrate, or a silicon-on-insulator (SOI) substrate, but not limited thereto. In some embodiments, semiconductor units (such as silicon based field effect transistors, not shown) may be formed on the substrate 10 before the step of forming the interlayer dielectric 20, and the interlayer dielectric 20 may be formed after the step of forming the semiconductor units and cover the semiconductor units, but not limited thereto. The material of the interlayer dielectric 20 may include silicon oxynitride, silicon oxide, or other appropriate dielectric materials. The top metal structure 40P is disposed on the interlayer dielectric 20. The top metal structure 40P includes a bottom portion 41 and a top portion 42. The top portion 42 is disposed on the bottom portion 41, and the bottom portion 41 may be disposed between the interlayer dielectric 20 and the top portion 42 in a thickness direction (such as a first direction D1 shown in FIG. 1) of the substrate 10. The bottom portion 41 includes a first sidewall SW1, and the top portion 42 includes a second sidewall SW2. A slope of the first sidewall SW1 is larger than a slope of the second sidewall SW2. It is worth noting that a top surface (such as a first top surface S20 shown in FIG. 1) of the interlayer dielectric 20 is regarded as a horizontal surface in the calculation of the slope of the first sidewall SW1 and the slope of the second sidewall SW2, but not limited thereto. In some embodiments, an included angle between the first sidewall SW1 and the first top surface S20 of the interlayer dielectric 20 may be larger than 45 degrees and smaller than 90 degrees, and the slope of the first sidewall SW1 may be larger than 1, but not limited thereto. The material of the top metal structure 40P may include aluminum (Al), silver (Ag), chromium (Cr), titanium (Ti), molybdenum (Mo), a compound of the above-mentioned materials, a stack layer of the above-mentioned materials, an alloy of the above-mentioned materials, or other suitable metal conductive materials. The passivation layer 60 is conformally disposed on the second sidewall SW2, the first sidewall SW1, the first top surface S20 of the interlayer dielectric 20, and a top surface (such as a second top surface S42 shown in FIG. 1) of the top metal structure 40P.

In some embodiments, the passivation layer 60 may include a single layer structure or a multiple layer structure of insulation materials such as silicon nitride, silicon oxynitride, silicon oxide, or phosphosilicate glass (PSG), but not limited thereto. For example, the passivation layer 60 may include a first layer 61 and a second layer 62. The first layer 61 may be conformally formed on the second sidewall SW2, the first sidewall SW1, the first top surface S20 of the interlayer dielectric, and the second top surface S42 of the top metal structure 40P, and the second layer 62 may be conformally formed on the first layer 61. Additionally, in some embodiments, the first layer 61 may be a PSG layer, and the second layer 62 may be a silicon nitride layer, but not limited thereto.

As shown in FIG. 1, in some embodiments, the top portion 42 of the top metal structure 40P may be directly connected with the bottom portion 41 of the top metal structure 40P, the second sidewall SW2 of the top portion 42 may be directly connected with and directly contact the first sidewall SW1 of the bottom portion 41, and the first sidewall SW1 of the bottom portion 41 may be directly connected with and directly contact the first top surface S20 of the interlayer dielectric 20. Additionally, the second sidewall SW of the top portion 42 may be directly connected with and directly contact the second top surface S42, and the top metal structure may be regarded as a narrow top and wide bottom structure. A cross-sectional shape of the top portion 42 and a cross-sectional shape of the bottom portion 41 may be a trapezoid respectively, and the bottom line of the trapezoid of the top portion 42 may be the top line of the trapezoid of the bottom portion 41, but not limited thereto. Additionally, the top metal structure 40P requires a specific thickness for reducing the bulk resistance of the top metal structure 40P. For example, in some embodiments, a thickness (such as a first thickness T40 shown in FIG. 1) of the top metal structure 40P may be larger than or equal to 14000 angstroms, but not limited thereto. Therefore, the first thickness T40 of the top metal structure 40P will be relatively larger than a thickness (such as a fourth thickness T60 shown in FIG. 1) of the passivation layer 60. Compared with a top metal structure including a single slope sidewall only, the top metal structure 40P in the present invention includes at least two sidewalls with different slopes for improving the covering condition of the passivation layer 60 formed on the top metal structure 40P and the interlayer dielectric 20. The stress of the passivation layer 60 at corners (such as a corner between the second sidewall SW2 and the second top surface S42 and/or a corner between the first sidewall SW1 and the first top surface S20) may be mitigated and released because the included angle between the second top surface S42 and the second sidewall SW2 becomes larger relatively.

Cracks in the passivation layer 60 may be avoided, and the product manufacturing yield and the product reliability may be improved accordingly.

In some embodiments, for lowering the influence of the top portion 42 of the top metal structure 40P on the bulk resistance of the top metal structure 40P, a thickness (such as a second thickness T41 shown in FIG. 1) of the bottom portion 41 of the top metal structure 40P may be larger than a thickness (such as a third thickness T42 shown in FIG. 1) of the top portion 42 of the top metal structure 40P, but not limited thereto. In some embodiments, the third thickness T42 of the top portion 42 of the top metal structure 40P may be larger than the second thickness T41 of the bottom portion 41 of the top metal structure 40P for further improving the covering condition of the passivation layer 60 and reducing the probability of cracks generated in the passivation layer 60. Additionally, in some embodiments, the connection structure 100 of the semiconductor device may further include an interconnection structure 30 disposed in the interlayer dielectric 20, and the top metal structure may be electrically connected with the interconnection structure 30. Semiconductor units (not shown) formed on the substrate 10 may be electrically connected with the top metal structure 40P via the interconnection structure 30. The interlayer dielectric 20, the interconnection structure 30, and the top metal structure 40P may belong to the back end of line (BEOL) process of the semiconductor manufacturing process, but not limited thereto. In some embodiments, the interconnection structure 30 may include a metal layer 31 and a via plug 32. The via plug 32 may be disposed between the metal layer 31 and the top metal structure 40, and the top metal structure 40P may be electrically connected with the metal layer 31 by the via plug 32. In addition, a width (such as a first width W31 shown in FIG. 1) of the metal layer 31 in a horizontal direction (such as a second direction D2 shown in FIG. 1) may be smaller than a width (such as a second width W41 shown in FIG. 1) of the top metal structure 40P in the horizontal direction, and the first thickness T40 of the top metal structure 40P may be larger than a thickness (such as a fifth thickness T31 shown in FIG. 1) of the metal layer 31 of the interconnection structure 30, but not limited thereto. The metal layer 31 and the via plug 32 may be formed by forming recesses in the interlayer dielectric 20 and filling the recesses with a barrier layer and a conductive material, but not limited thereto. The barrier layer mentioned above may include titanium nitride, tantalum nitride, or other suitable barrier materials, and the conductive material mentioned above may include materials with relatively lower resistivity, such as copper, aluminum, or tungsten, but not limited thereto. In some embodiments, the interconnection structure 30 may be composed of a plurality of the metal layers 31 and a plurality of the via plugs 32 alternately disposed and connected with one another, but not limited thereto.

Figure 2:
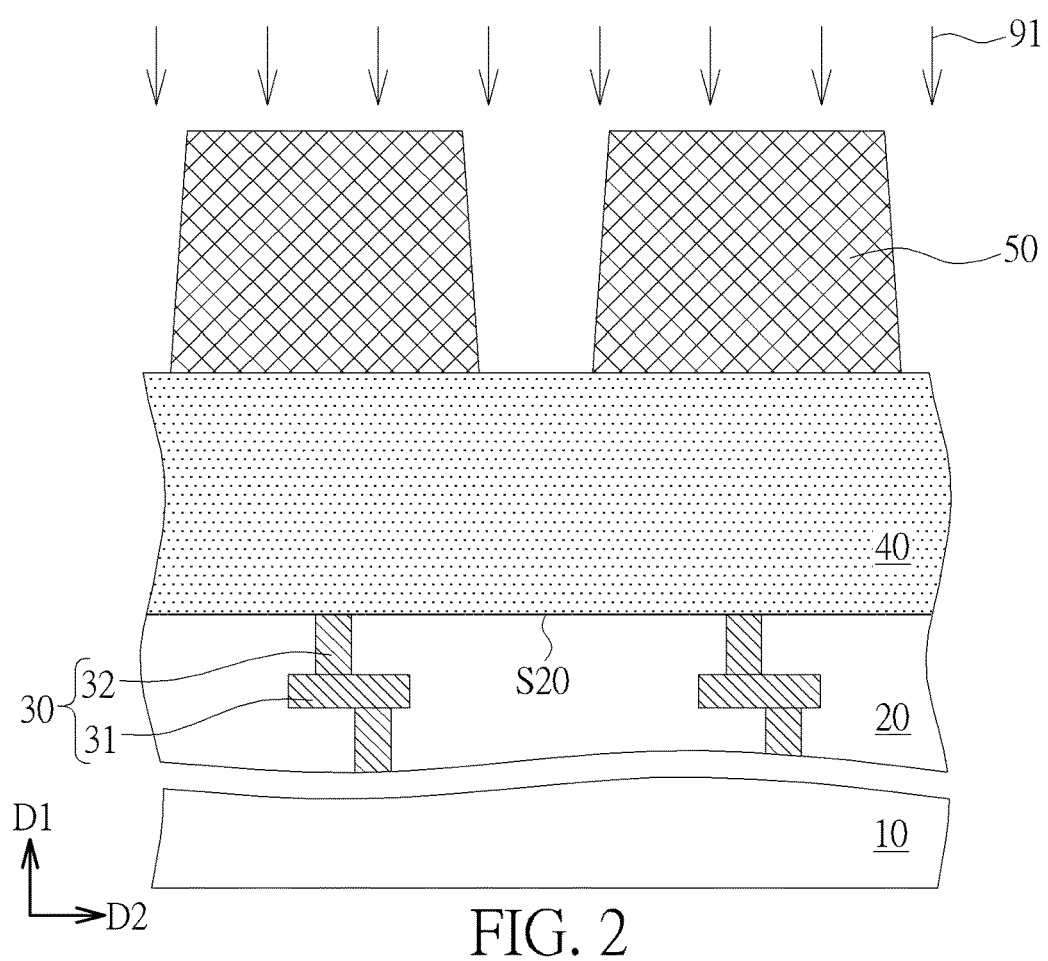
Figure 3:
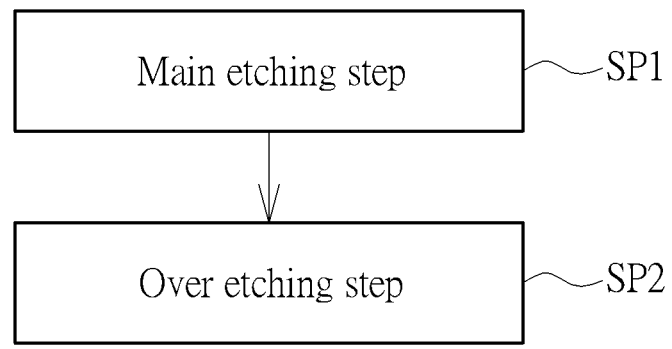
Figure 4:
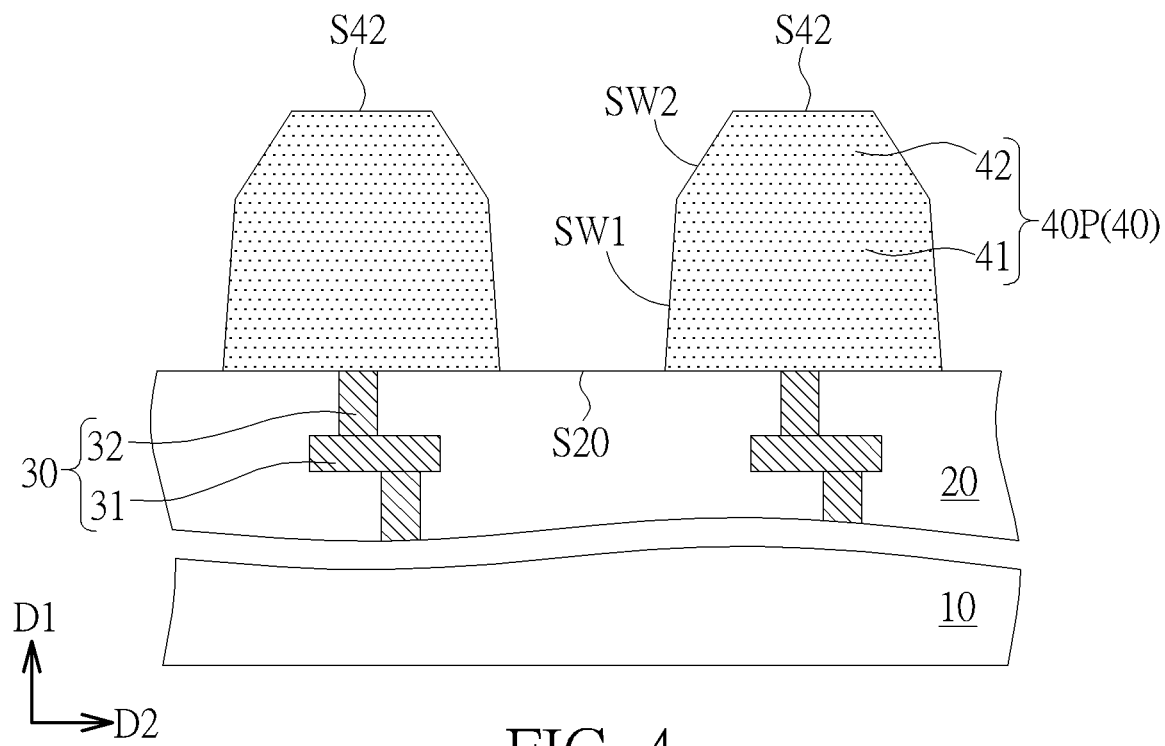

Please refer to FIGS. 1-4. FIGS. 2-4 are schematic drawings illustrating a manufacturing method of a connection structure of a semiconductor device according to an embodiment of the present invention. FIG. 3 is a flow chart of an etching process, FIG. 4 is a schematic drawing in a step subsequent to FIG. 2, and FIG. 1 may be regarded as a schematic drawing in a step subsequent to FIG. 4. As shown in FIG. 1, the manufacturing method of the connection structure 100 of the semiconductor device in this embodiment may include the following steps. Firstly, the substrate 10 is provided. The interlayer dielectric 20 is formed on the substrate 10. The top metal structure 40P is formed on the interlayer dielectric 20. The top metal structure 40P includes the bottom portion 41 and the top portion 42 disposed on the bottom portion 41. The bottom portion 41 includes the first sidewall SW1, and the top portion 42 includes the second sidewall SW2. The slope of the first sidewall SW1 is larger than the slope of the second sidewall SW2. The passivation layer 60 is conformally formed on the second sidewall SW2, the first sidewall SW1, and the first top surface S20 of the interlayer dielectric 10.

Specifically, the method of forming the top metal structure 40P in this embodiment may include but is not limited to the following steps. As shown in FIG. 2, a top metal layer 40 is formed on the interlayer dielectric 20, and a patterned photoresist layer 40 is then formed on the top metal layer 40. Subsequently, an etching process 91 is performed to the top metal layer 40 with the patterned photoresist layer 40 as a mask for forming the top metal structure 40P shown in FIG. 1. As shown in FIG. 2 and FIG. 3, in some embodiments, the etching process 91 may include a main etching step performed at step SP1 and an over etching step performed at step SP2. In other words, the over etching step may be performed after the main etching step.

As shown in FIGS. 2-4, the main etching step may be used to etch the top metal layer 40 which is not covered by the patterned photoresist layer 50 and expose at least a part of the first top surface S20 of the interlayer dielectric 20, and the over etching step may be used to further etch the top metal layer 40 for forming the demanded distribution of the first sidewall SW1 and the second sidewall SW2. In some embodiments, the main etching step may have a first etching rate (may be regarded as R1, for example) to the patterned photoresist layer 50, the over etching step may have a second etching rate (may be regarded as R2, for example) to the patterned photoresist layer 50, and the first etching rate is higher than the second etching rate. Additionally, the main etching step may have a third etching rate (may be regarded as R3, for example) to the top metal layer 40, the over etching step may have a fourth etching rate (may be regarded as R4, for example) to the top metal layer 40, and a ratio of the third etching rate to the first etching rate (such as R3/R1) is lower than a ratio of the fourth etching rate to the second etching rate (such as R4/R2). In other words, the main etching step has a more significant etching effect on the photoresist layer 50 in compared with the over etching step, and the etching selectivity to the top metal layer 40 in the main etching step is lower than the etching selectivity to the top metal layer 40 in the over etching step. In some embodiments, the etching characteristics of the main etching step mentioned above may be achieved by lowering the manufacturing pressure and increasing the ion bombardment effect, and the top metal layer 40 adjoining the patterned photoresist layer 50 may be etched by the main etching step for forming the condition similar to the second sidewall SW2, but not limited thereto. Additionally, in some embodiments, more polymers may be generated to protect the sidewall by modifying the ratio of the process gas in the over etching step, and the first sidewall SW which is steeper may be formed accordingly, but not limited thereto. It is worth noting that the thickness of the patterned photoresist layer 50 has to be increased relatively for ensuring the effect of being a mask in the etching process 91 because the etching rate to the patterned photoresist layer 50 is increased relatively in the main etching step. For instance, the thickness of the patterned photoresist layer 50 may be larger than or equal to 35000 angstroms, but not limited thereto.

As shown in FIG. 2 and FIG. 4, the patterned photoresist layer 50 may be removed after the etching process 91. Subsequently, as shown in FIG. 1, the passivation layer 60 is conformally formed on and covers the first top surface S20 of the interlayer dielectric 20, the first sidewall SW1, the second sidewall SW2, and the second top surface S42 of the top metal structure 40P. Additionally, the manufacturing method of the connection structure 100 of the semiconductor device may further include forming the interconnection structure 30 in the interlayer dielectric 20. The interconnection structure 30 may be formed before the step of forming the top metal structure 40P, and the top metal structure 40P may be electrically connected with the interconnection structure 30.

To summarize the above descriptions, in the connection structure of the semiconductor device and the manufacturing method thereof according to the present invention, the top metal structure including at least two sidewalls with different slopes may be formed by the etching process, and the covering condition of the passivation layer formed on the top metal structure and the interlayer dielectric may be improved accordingly. In addition, the stress of the passivation layer at the corners covered by the passivation layer may be mitigated for avoiding cracks in the passivation layer, and the purpose of improving the product manufacturing yield and the product reliability may be achieved accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a connection structure of a semiconductor device, comprising:
   providing a substrate;
   forming an interlayer dielectric on the substrate;
   forming a top metal structure on the interlayer dielectric, wherein the top metal structure comprises:
      a bottom portion comprising a first sidewall; and
      a top portion disposed on the bottom portion, wherein the top portion comprises a second sidewall, and a slope of the first sidewall is larger than a slope of the second sidewall; and
   forming a passivation layer conformally on the second sidewall, the first sidewall, and a top surface of the interlayer dielectric, wherein the second sidewall of the top portion is directly connected with the first sidewall of the bottom portion, the first sidewall is directly connected with the top surface of the interlayer dielectric, and the second sidewall of the top portion consists of a planar surface in a cross section diagram of the top metal structure,
   wherein the step of forming the top metal structure comprises:
      forming a top metal layer on the interlayer dielectric;
      forming a patterned photoresist layer on the top metal layer; and
      performing an etching process to the top metal layer with the patterned photoresist layer as a mask, wherein the etching process comprises:
         a main etching step; and
         an over etching step performed after the main etching step, wherein the main etching step has a first etching rate to the patterned photoresist layer, the over etching step has a second etching rate to the patterned photoresist layer, and the first etching rate is higher than the second etching rate, wherein the main etching step has a third etching rate to the top metal layer, the over etching step has a fourth etching rate to the top metal layer, and a ratio of the third etching rate to the first etching rate is lower than a ratio of the fourth etching rate to the second etching rate.

2. The manufacturing method of the connection structure of the semiconductor device according to claim 1, wherein a thickness of the bottom portion of the top metal structure is larger than a thickness of the top portion of the top metal structure.

3. The manufacturing method of the connection structure of the semiconductor device according to claim 1, wherein a thickness of the top metal structure is larger than a thickness of the passivation layer.

4. The manufacturing method of the connection structure of the semiconductor device according to claim 1, further comprising:

forming an interconnection structure in the interlayer dielectric, wherein the top metal structure is electrically connected with the interconnection structure.

5. The manufacturing method of the connection structure of the semiconductor device according to claim 4, wherein the interconnection structure comprises:

a metal layer; and a via plug disposed between the metal layer and the top metal structure, wherein the top metal structure is electrically connected with the metal layer by the via plug, and a width of the metal layer is smaller than a width of the top metal structure.

6. The manufacturing method of the connection structure of the semiconductor device according to claim 5, wherein a thickness of the top metal structure is larger than a thickness of the metal layer of the interconnection structure.

* * * * *